United States Patent
Ben Smida et al.

(10) Patent No.: US 10,491,171 B2
(45) Date of Patent: *Nov. 26, 2019

(54) SYSTEM TO GENERATE AN ANALOG SIGNAL AND SYNTHESIZE A PREDISTORTION FUNCTION

(71) Applicants: KING FAHD UNIVERSITY OF PETROLEUM AND MINERALS, Dhahran (SA); The University of Bristol, Bristol (GB)

(72) Inventors: Souheil Ben Smida, Bristol (GB); Oualid Hammi, Sharjah (AE); Kevin Andrew Morris, Bristol (GB)

(73) Assignees: King Fahd University of Petroleum and Minerals, Dhahran (SA); The University of Bristol, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/213,504

(22) Filed: Dec. 7, 2018

(65) Prior Publication Data

US 2019/0109568 A1    Apr. 11, 2019

Related U.S. Application Data

(63) Continuation of application No. 15/209,008, filed on Jul. 13, 2016, now Pat. No. 10,181,825.

(Continued)

(51) Int. Cl.
*H03F 1/32* (2006.01)
*H03F 3/24* (2006.01)
(Continued)

(52) U.S. Cl.
CPC .......... *H03F 1/3247* (2013.01); *H03F 3/189* (2013.01); *H03F 3/24* (2013.01); *H04B 1/0475* (2013.01);

(Continued)

(58) Field of Classification Search
CPC .......... H03F 1/3247; H03F 3/189; H03F 3/24; H03F 2200/451; H04B 1/0475; H04B 2001/0425
See application file for complete search history.

(56) References Cited

U.S. PATENT DOCUMENTS 6,774,834 B2    8/2004    Dartois
9,172,334 B2    10/2015   Hammi
(Continued)

FOREIGN PATENT DOCUMENTS

CN    104320095 A    1/2015

OTHER PUBLICATIONS

Teng Wang, "Digital Adaptive Predistortion for Unmanned Aerial Vehicle Communications with Under-Sampling Method", Universitat Politècnica De Catalunya, Master in Aerospace Science & Technology, Dec. 2014, 58 pages.

(Continued)

*Primary Examiner* — Manuel L Barbee
(74) *Attorney, Agent, or Firm* — Oblon, McClelland, Maier & Neustadt, L.L.P.

(57) ABSTRACT

Aspects of the disclosure provide a method and system for power amplifier characterization and digital predistortion. The method includes receiving a test signal including K samples with a sampling rate $f_S$, generating a synthetic test signal including the test signal and a sequence of (N−1) delayed versions of the test signal, generating an undersampled signal including M samples by sampling, at a sampling rate $f_S/N$, an output signal of a device-under-test (DUT) with the synthetic test signal as an input of the DUT, the M samples of the under-sampled signal including N segments each including K/N samples, and generating a reconstructed signal including the M samples of the under-sampled signal.

7 Claims, 16 Drawing Sheets

Related U.S. Application Data

(60) Provisional application No. 62/246,845, filed on Oct. 27, 2015.

(51) Int. Cl.
  *H04B 1/04* (2006.01)
  *H03F 3/189* (2006.01)

(52) U.S. Cl.
  CPC .......... *H03F 2200/451* (2013.01); *H04B 2001/0425* (2013.01)

(56) References Cited

U.S. PATENT DOCUMENTS

2005/0088230 A1    4/2005    Johnson et al.
2013/0094612 A1    4/2013    Kim et al.
2013/0343483 A1    12/2013    Bai
2014/0269988 A1    9/2014    Schafferer et al.

OTHER PUBLICATIONS

David Wisell, et al., "A Technique to Extend the Bandwidth of an RF Power Amplifier Test Bed", IEEE Transactions on Instrumentation and Measurement, vol. 56, Issue 4, Aug. 2007, pp. 1488-1494 (Abstract only).

Chao Yu, et al., "Band-Limited Volterra Series-Based Digital Predistortion for Wideband RF Power Amplifiers", IEEE Transactions on Microwave Theory and Techniques, vol. 60, No. 12, Dec. 2012, pp. 4198-4208.

Yuelin Ma, et al., "Wideband Digital Predistortion Using Spectral Extrapolation of Band-Limited Feedback Signal", IEEE Transactions on Circuits and Systems—I: Regular Papers, vol. 61, No. 7, Jul. 2014, pp. 2088-2097.

Youjiang Liu, et al., "Novel Technique for Wideband Digital Predistortion of Power Amplifiers With an Under-Sampling ADC", , IEEE Transactions on Microwave Theory and Techniques, vol. 62, No. 11, Nov. 2014, pp. 2604-2617.

| Signal | Number of Samples | Sampling Rate (Hz) | Waveform Length (s) |
|---|---|---|---|
| Original input ($x$) | $K$ | $f_s$ | $K/f_s$ |
| Synthetic input ($x_{syn}$) | $N \cdot K$ | $f_s$ | $N \cdot (K/f_s)$ |
| Synthetic output ($y_{syn}$) | $N \cdot K$ | $f_s$ | $N \cdot (K/f_s)$ |
| Acquired output ($y_{LS}$) | $K$ | $f_s/N$ | $N \cdot (K/f_s)$ |
| Reconstructed output ($y_{rec}$) | $K$ | $f_s$ | $K/f_s$ |
| Output using conventional approach ($y$) | $K$ | $f_s$ | $K/f_s$ |

*Fig. 4*

TABLE II
INVERSE CLASS-F PA DPD PERFORMANCES

| Configuration | ACLR (dB) | | ACLR alternate (dB) | | Maximum EVM (%) |
|---|---|---|---|---|---|
| | Left | Right | Left | Right | |
| Without DPD | 32 | 33 | 50 | 50 | 8 |
| DPD implemented using classic high speed vector signal analysis | 50.6 | 50.4 | 52.5 | 52.2 | <1 |
| DPD implemented using proposed technique with N=2 | 50.6 | 50.3 | 52.5 | 52 | <1 |
| DPD implemented using proposed technique with N=3 | 50.8 | 50.6 | 52.5 | 52.3 | <1 |
| DPD implemented using proposed technique with N=4 | 50.6 | 50.4 | 52.5 | 52.2 | <1 |
| DPD implemented using proposed technique with N=5 | 50.6 | 50.6 | 52.5 | 52.2 | <1 |

Fig. 10

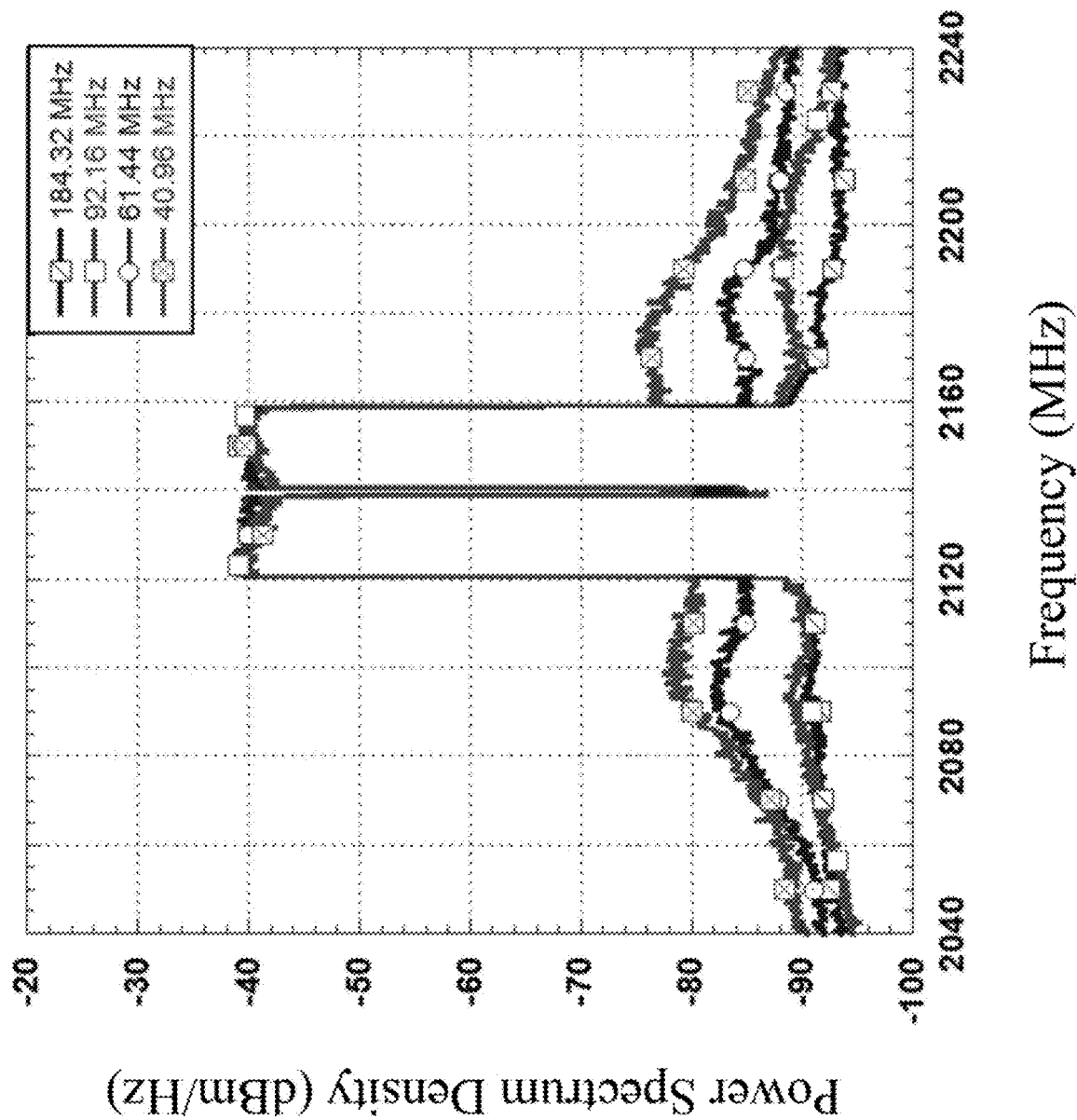

SYSTEM TO GENERATE AN ANALOG SIGNAL AND SYNTHESIZE A PREDISTORTION FUNCTION

CROSS-REFERENCE TO RELATED APPLICATIONS

The present application is a Continuation of Ser. No. 15/209,008, now allowed, having a filing date of Jul. 13, 2016 which claims benefit of priority to U.S. Provisional Application No. 62/246,845 which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Modern and future wireless communication systems are designed to provide high data rate capability. Accordingly, architectures of transmitters in wireless communication systems have evolved to accommodate complex modulation schemes with high spectral efficiency. These architectures are designed to ensure the transmission of wideband signals in a linear manner. Nonlinear behaviors in transmitters will distort the transmitted signal and hence corrupt the transmitted data. Radio frequency power amplifiers (RFPAs) are the most nonlinear and power consuming blocks in a transmitter's architecture. Therefore, special measures are taken to increase an RFPA linearity and efficiency.

Digital predistortion (DPD) is one of the most used linearization methods for cancelling out RFPAs nonlinear behavior. Predistortion is a technique used to improve the linearity of radio transmitter amplifiers. Predistortion circuit inversely models the amplifier's gain and phase characteristics and, when combined with the amplifier, produces an overall system that is more linear and reduces the distortions at the output of the amplifier. Specifically, predistortion circuit implements a nonlinear function upstream of the PA complementary to the nonlinear function of the PA to be linearized. Accordingly, the cascade made of the predistortion circuit and the PA will operates as a linear amplification system. Predistortion can be implemented in an analog as well as digital manner known as DPD.

DPD requires characterization of RFPAs. PA characterization process generates a behavior model describing nonlinear property of the PA. The behavior model can be a mathematical function including a set of coefficients. The coefficients can be calculated from PA input and output measurement data. Based on a PA behavior model, a DPD function inversing the PA behavior model can be created.

During the PA characterization process, PA output signal over a certain bandwidth is measured and analyzed. This bandwidth value is typically five times the input signal bandwidth. Therefore, in order to implement an effective DPD, the feedback path used to demodulate the PA output signal requires a baseband sampling rate several times faster than that of the baseband signal to be transmitted. For example, in modern wireless communication systems, the required sampling speed of the feedback path receiver is expected to be in the range of 500 Msps (Mega-samples per second) for 100 MHz wide LTE-Advanced signals.

In a research and development laboratory environment, power amplifiers can be characterized using modulated test signals. This requires the use of an arbitrary waveform generator (AWG) to feed the amplifier with the RF test signal and a vector signal analyzer (VSA) to demodulate the amplifier's output signal. Only expensive VSAs might be able to offer the measurement capabilities required by LTE and LTE-A signals. Moreover, in some cases, the available instruments cannot meet the sampling rate and dynamic range needed for PA linearization applications.

In addition to instrument based PA characterization and predistortion test benches, a wide range of other platforms was reported in the literature. For example, dedicated self-developed PA characterization and digital predistortion platforms using in-house designed signal generators and receivers were reported. In such type of platforms, the sampling rate limitation of the feedback path is also a serious challenge that needs to be addressed. Thus, it is essential to come up with experimental procedures that would allow for the extension of the observation bandwidth of vector signal analysis test and measurement equipment in particular, and the feedback path of experimental power amplifiers characterization and digital predistortion systems in general.

To address the above issue, several signal acquisition techniques have been reported in the literature for various applications. The Subsampling techniques were widely used in the presence of periodic signals with a relatively short time period value, as well as complex modulated signals. In the case of modulated signals, the use of under-sampling techniques requires spacing between the different carriers in order to avoid spectrum overlap. Accordingly, under-sampling techniques are successfully applied for dual band applications. However, under-sampling techniques are not suitable for wideband systems involving contiguous carrier aggregation. The frequency stitching technique provides wideband PA characterization by manipulating measurement data in the frequency domain leading to relatively complex signal processing.

Other approaches have been proposed to extend the bandwidth of digital predistortion systems. These include the band-limited Volterra series based digital predistortion approach in which the PA's and predistorter's outputs are filtered to reduce the sampling rate requirements. In this work, it was demonstrated that the band-limited Volterra series approach outperforms conventional DPD systems operating at the same sampling rate. Though, a major limitation is that the correction bandwidth of this technique is equal to its observation bandwidth in the sense that the band-limited DPD is unable to compensate for PA distortions outside the observation bandwidth. Digital predistortion architectures with a correction bandwidth that exceeds the observation bandwidth have been reported in another work. In this work, a spectral extrapolation technique was proposed to extend the correction bandwidth of DPD by means of computationally intensive signal processing algorithms. In a further work, an under-sampling restoration DPD (USR-DPD) was introduced. The USR-DPD uses an iterative approach to synthesize the predistortion function. Its ability to significantly reduce the required sampling rate in the feedback path was demonstrated. Though, to ensure distortion mitigation beyond the observation bandwidth, a band-pass filter is required. This can be perceived as a drawback since the analog band-pass filter characteristics are signal dependent. Thus, a different filter is required whenever the bandwidth of the input signal changes. In another work, a sequential two-step synthesis of a two-box digital predistorter was proposed. The proposed predistorter considerably reduces the required sampling rate in the feedback path. However, this technique is suitable for a specific type of digital predistortion functions which are built using a two-box structure made of the cascade of a first dynamic predistortion function followed by a memoryless one. Even though the above research results are of great interest to the case of LTE-A power amplifiers, there is a need for other alternative techniques for broadband behavioral modeling and digital predistortion using low speed analog to digital converters.

SUMMARY

Aspects of the disclosure provide a method and system for wideband radio frequency power amplifier characterization and digital predistortion. The technique employed in the method and system relaxes the sampling speed requirement on an analog-to-digital converter (ADC) in a receiver in a feedback path of a PA characterization and/or predistortion system. The technique is based on manipulating test signals in the time-domain to accommodate low sampling speed capability of ADCs. The technique can increase the observation bandwidth of the receiver and enable a significant increase in the correction bandwidth of a digital predistortion system.

A method includes receiving a test signal including K samples with a sampling rate $f_S$, generating a synthetic test signal including the test signal and a sequence of (N−1) delayed versions of the test signal. The first delayed version of the test signal has one sample delay from the test signal, and each other delayed version of the test signal in the sequence has one sample delay from a preceding delayed version. The delayed samples of each delayed version are added at the end of the respective delayed version. The method further includes generating an under-sampled signal including M samples by sampling, at a sampling rate $f_S/N$, an output signal of a device-under-test (DUT) with the synthetic test signal as an input of the DUT, the M samples of the under-sampled signal including N segments each including K/N samples, and generating a reconstructed signal including the M samples of the under-sampled signal.

A system includes a processing circuitry configured to receive a test signal including K samples with a sampling rate $f_S$, and generate a synthetic test signal including the test signal and a sequence of (N−1) delayed versions of the test signal. The first delayed version of the test signal has one sample delay from the test signal, and each other delayed version of the test signal in the sequence has one sample delay from a preceding delayed version. Delayed samples of each delayed version being added at the end of the respective delayed version. The processing circuitry is further configured to generate an under-sampled signal including M samples by sampling, at a sampling rate $f_S/N$, an output signal of a device-under-test (DUT) with the synthetic test signal as an input of the DUT, the M samples of the under-sampled signal including N segments each including K/N samples, and to generate a reconstructed signal including the M samples of the under-sampled signal.

BRIEF DESCRIPTION OF THE DRAWINGS

Various embodiments of this disclosure that are presented as examples will be described in detail with reference to the following figures, wherein like numerals reference like elements, and wherein:

FIG. 4 shows a table summarizing characteristics of different signals in the FIG. 1 example;

FIG. 10 shows results of DPD performance as a function of the value of N;

FIG. 12A shows measured spectra at an output of a DUT as a function of vector signal analyzer (VSA) sampling rate with conventional DPD;

DETAILED DESCRIPTION

Figure 1:
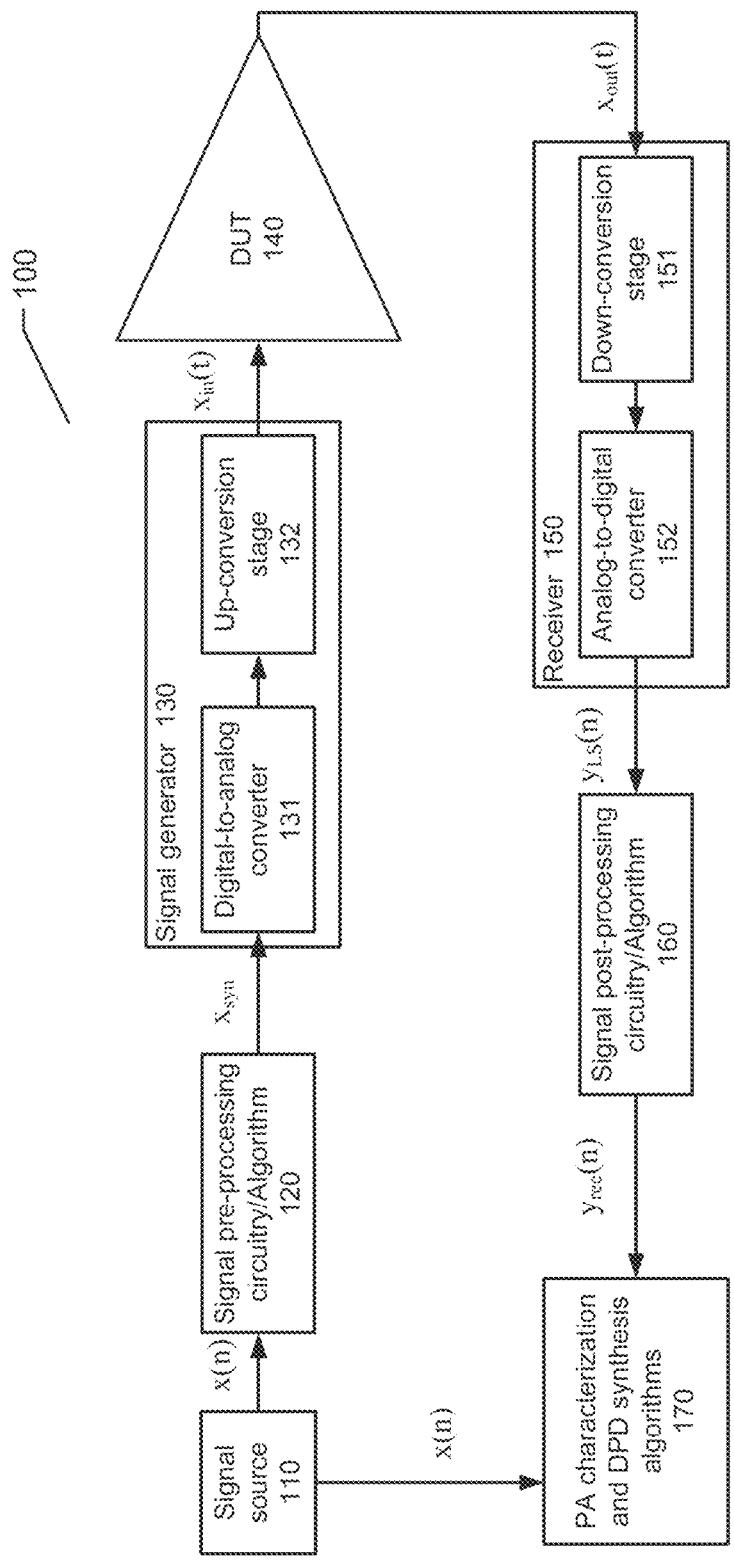
FIG. 1 shows a block diagram of an exemplary system for power amplifier (PA) characterization and digital predistortion (DPD) according to some embodiments of the disclosure.

One objective of the disclosure is to provide a characterization technique that, for example, can allow for extending observation bandwidth of a receiver at a feedback path of a power amplifier (PA) characterization and/or digital predistortion system without having to increase sampling speed of an analog-to-digital converter (ADC) in the receiver. The technique is labeled MR-DAD for multiplexing based reconstruction of delayed, appended and down-sampled waveforms.

In a PA characterization context, the input signal for testing is known and remains constant in terms of its statistics. This results in a stable PA response. Exploiting this characteristic of PAs, in an example, the MR-DAD technique is based on generating several copies of the input signal, and concatenating them with appropriate delay in order to result in a synthetic test signal. This synthetic test signal has the same characteristics (including statistics and bandwidth) as the original input signal. Thus, it will not have any noticeable impact on the power amplifier's behavior.

In one example, the synthetic test signal is built using N (where N is an integer greater than 1) versions of the original input signal, and each of these versions is generated by delaying and wrapping the original input signal waveform.

The synthetic baseband waveform is then used to generate the RF signal that will drive a device under test (DUT). At the receiver side, acquisition of the power amplifier output waveform is performed at a low sampling speed that is a function of the number N of copies of the original waveform used to build the synthetic test signal. This approach allows for decreasing the sampling rate required at the receiver by a factor of N without compromising its accuracy as it will be shown below.

The above MR-DAD technique adapts and employs the under-sampling concept to the case of contiguous spectrums. Under-sampling ADCs have been used to reduce the sampling rate requirement in the feedback path of PA characterization and predistortion systems in prior arts. However, under-sampling a signal implies that frequency components from high order Nyquist zones will be folded back into the first Nyquist zone. The overlap between the frequency components coming from various Nyquist zones compromises the quality of the under-sampled signal and introduces errors between the reconstructed high speed signal and its original version. Thus, the use of under-sampling was limited to multi-band and widely spaced non-contiguous carriers in which it is possible to avoid the overlap between the aliased frequency components. Conversely, in an example of the MR-DAD technique, digital signal pre- and post-processing is adopted enabling the use of under-sampling techniques in signals having contiguous spectrum. The aliasing due to the under-sampling is recovered through appropriate multiplexing of the low speed sampled signal.

Multiplexing is commonly used in interleaved ADCs in order to reconstruct a high speed signal from a plurality of under-sampled versions of the same signal. However, in interleaved ADC techniques, a plurality of ADCs operating at low speed are used to sample a single signal waveform with a controlled delay between the ADCs, while in the MR-DAD technique, for example, a single ADC operating at low speed is used to sample multiple copies of a signal waveform delayed in such a way that it emulates the acquisition of interleaved ADCs. The advantages of the MR-DAD technique over interleaved ADCs are twofold. First, in order to reduce the sampling rate by a factor N, it requires only a single ADC in contrast with N ADCs in the case of interleaved ADCs. Moreover, the use of interleaved ADCs requires tedious calibrations and a perfect time alignment in order to precisely reconstruct the high speed version of the under-sampled signal following the multiplexing step. Conversely, in an example of the MR-DAD technique, the signal is pre- and post-processed in the digital domain in order to ensure a perfect reconstruction of the high speed waveform following the multiplexing step.

FIG. 1 shows a block diagram of an exemplary system 100 for PA characterization and digital predistortion according to some embodiments of the disclosure. In one example, the system 100 includes a signal source 110, signal pre-processing circuitry/algorithms 120, signal generator 130, a DUT 140, a receiver 150, signal post-processing circuitry/algorithms 160, and a module 170 implementing PA characterization and/or DPD synthesis algorithms.

The signal source 110 is configured to generate a test signal x(n), such as a LTE-Advanced modulated signal or any signal to be transmitted. The signal pre-processing circuitry/algorithms 120 is configured to generate a synthetic test signal $x_{syn}$ through a digital signal processing process based on the test signal x(n) received from the signal source 110. The signal generator 130 is configured to receive the synthetic test signal $x_{syn}$ from the signal pre-processing circuitry/algorithms 120, and generate an RF analog signal $x_{in}(t)$. In one example, the signal generator 130 includes a digital-to-analog converter (DAC) 131, and a frequency up-conversion stage (UCS) 132. The DAC 131 is configured to convert the synthetic test signal $x_{syn}$ from a digital signal to an analog signal, and the frequency UCS 132 is configured to modulate the analog signal to a high frequency carrier.

The DUT 140 can be a non-linear RFPA that is configured to generate a scaled and distorted output signal $x_{out}(t)$ corresponding to the input RF analog signal $x_{in}(t)$.

The receiver 150 is configured to receive the analog signal $x_{out}(t)$ and generate an under-sampled signal $y_{LS}(n)$ including a sequence of samples. Specifically, the analog signal $x_{out}(t)$ is under-sampled at a sampling rate that is smaller than the sampling rate of the synthetic test signal $x_{syn}$. In one example, the receiver 150 includes a frequency down-conversion stage (DCS) 151, and an ADC 152. The frequency DCS 151 demodulates the analog signal $x_{out}(t)$ from the carrier frequency to a lower frequency suitable for the ADC 152 to perform the analog to digital conversion operation.

The signal post-processing circuitry/algorithms 160 is configured to receive the under-sampled signal $y_{LS}(n)$ and properly multiplex the samples in the under-sampled signal $y_{LS}(n)$ to obtain a reconstructed signal $y_{rec}(n)$. The receiver 150 and the signal post-processing circuitry/algorithms 160 form a feedback path providing a feedback signal (the reconstructed signal $y_{rec}(n)$) to the module 170. The feedback signal indicates distortion caused by the non-linearity of the DUT 140.

The module 170 implementing PA characterization and/or DPD synthesis algorithms is configured to receive the test signal x(n) and the reconstructed signal $y_{rec}(n)$, and accordingly derive a behavioral model of the DUT 140 for characterizing the DUT 140 and/or synthesize a digital predistortion function for compensating the non-linearity of the DUT 140.

The signal pre-processing circuitry/algorithms 120, the signal post-processing circuitry/algorithms 160, and the module 170 can be implemented using any suitable hardware, software, or combination thereof. In some examples, the signal pre-processing circuitry/algorithms 120, the signal post-processing circuitry/algorithms 160, and the module 170 are implemented using application specific integrated circuit (ASIC), field programmable gate array (FPGA), and the like.

In other examples, the signal pre-processing circuitry/algorithms 120, the signal post-processing circuitry/algorithms 160, and the module 170 are implemented using a processor executing program instructions stored in a memory. For example, functions of the signal pre-processing circuitry/algorithms 120, the signal post-processing circuitry/algorithms 160, and the module 170 can be implemented using software. The software can be stored in a memory of a computer, when executed by a processor in the computer, causing the processor to perform the functions. The memory can include one or more storage media. The storage media can include, but are not limited to, hard disk drive, optical disc, solid state drive, read-only memory (ROM), dynamic random access memory (DRAM), static random access memory (SRAM), flash memory, and the like. In addition, the memory can store other software components, such as operation systems, other application software, and data related with the other software component. The processor can include one or more processing units to execute program instructions to perform various tasks. In an example, the processor is a multi-core processor, such as a dual-core processor, a quad-core processor, and the like. In addition, the processor can have any suitable architecture, such as an x86 architecture, a reduced instruction set computing (RISC) architecture, a complex instruction set computing (CISC) architecture, and the like.

Figure 2B:
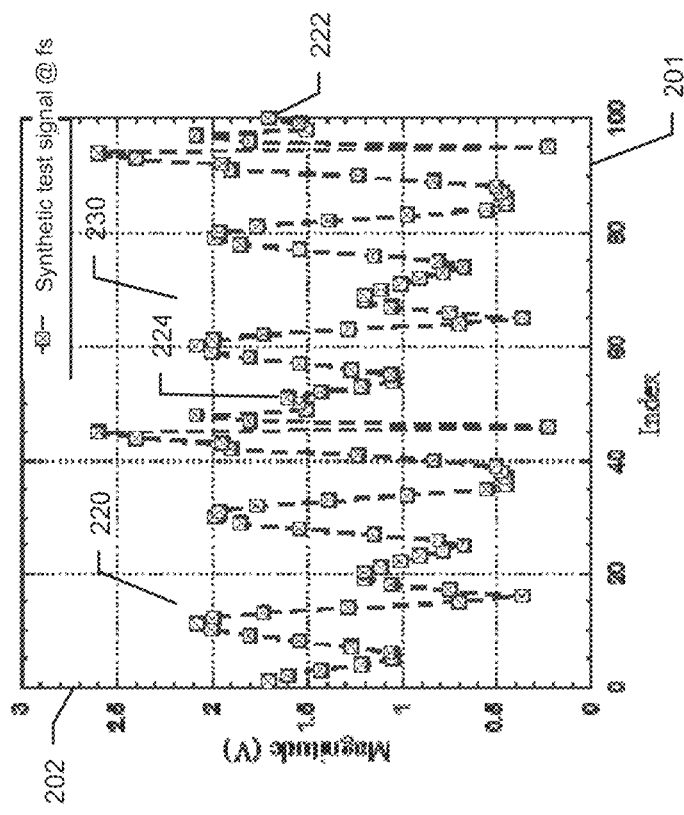
FIG. 2B shows an example of a synthetic test signal.
Figure 2A:
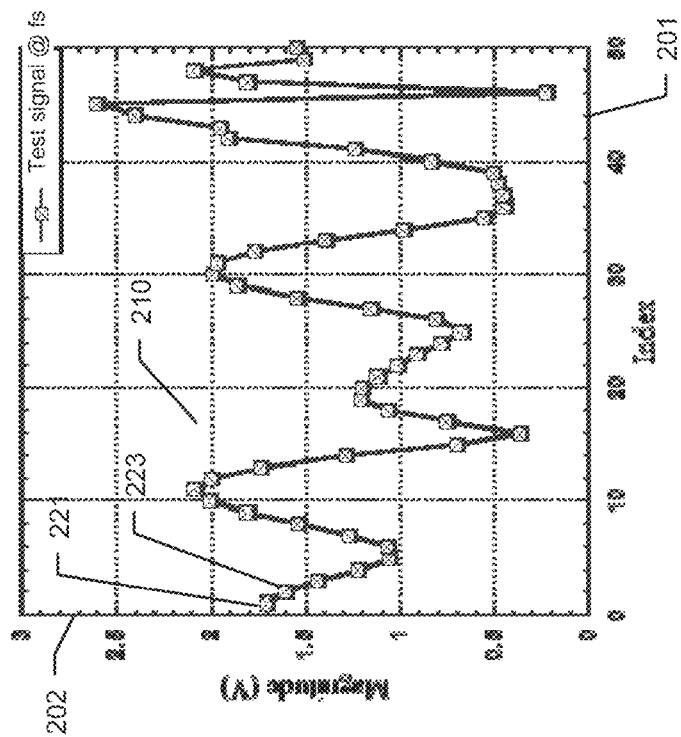
FIG. 2A shows an example of a test signal.

FIGS. 2A-2D show examples of the signals in the FIG. 1 example for N=2. In FIGS. 2A-2D, horizontal axes 201 represent sample indices, and vertical axes 202 represent amplitudes of each sample. Specifically, FIG. 2A shows an example of the test signal x(n) 210. As shown, an original waveform is initially sampled at a rate $f_S$ resulting in the test signal x(n) 210 including a sequence of samples with a sampling rate $f_S$.

FIG. 2B shows an example of the synthetic test signal $x_{syn}(n)$. As shown, for N=2, a second copy 230 of the original test signal x(n) 210 is appended to a first copy 220 of the original waveform of the test signal x(n) 210. In addition, the second copy 230 of the original test signal x(n) 210 is applied with a one sample delay. Specifically, a sample 222 in the second copy 230 corresponding a first sample 221 of the original test signal x(n) 210 is attached at the end of the second copy 230. Accordingly, a sample 224 in the second copy 230 corresponding to a second sample 223 of the original test signal x(n) 210 becomes the first sample of the second copy 230. Further, the synthetic test signal $x_{syn}$ has the same sampling rate $f_S$.

Figure 2D:
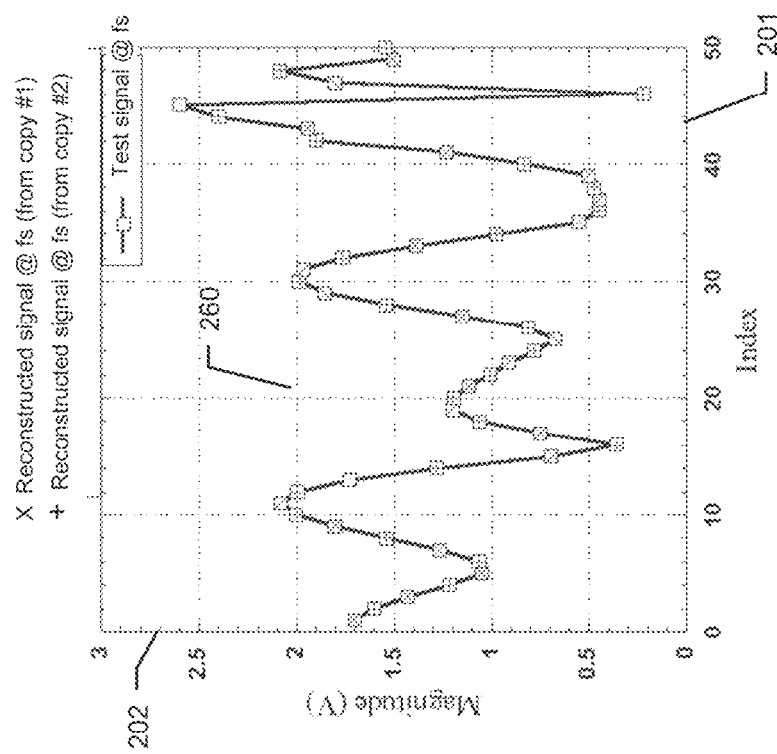
FIG. 2D shows an example of a reconstructed signal.
Figure 2C:
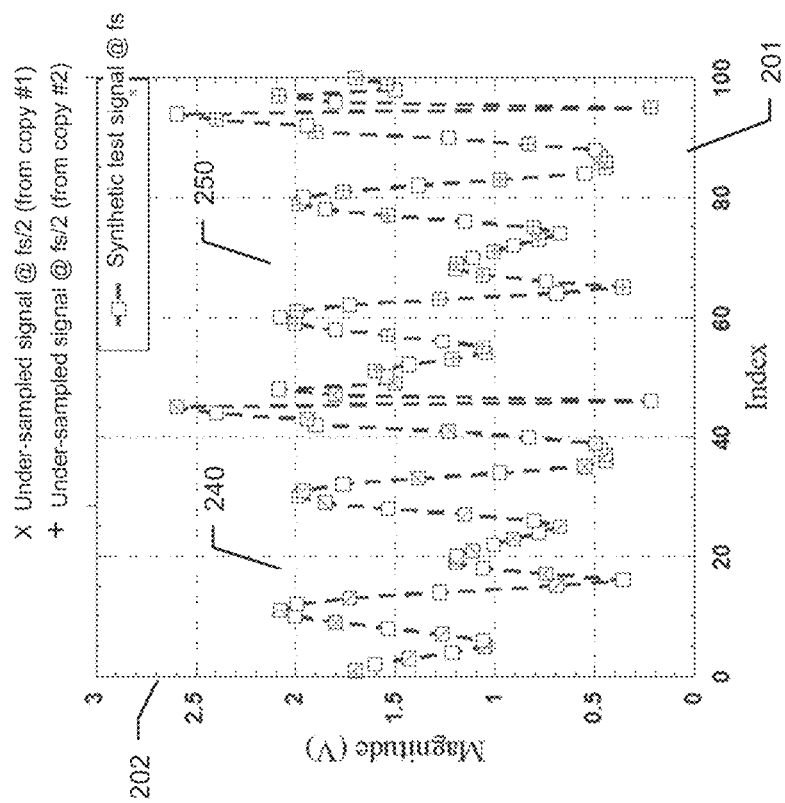
FIG. 2C shows an example of an under-sampled synthetic test signal.

FIG. 2C shows an example of the under-sampled signal $y_{LS}(n)$. As shown, the under-sampled signal $y_{LS}(n)$ is generated from a sampling operation on the synthetic test signal $x_{syn}$ in FIG. 2B with a sampling rate $f_S/2$. Specifically, the under-sampled signal $y_{LS}(n)$ includes a first and second half of samples 240 and 250 acquired from the first and second copy 220 and 230 in FIG. 2B, respectively. The first half of samples 240 includes samples having originally odd indices in the original test signal x(n) 210 in FIG. 2A, and the second half of samples 250 includes samples having originally even indices in the original test signal x(n) 210. Thus, all required samples of the original test signal x(n) 210 are acquired but not in sequence the same as the original test signal x(n) 210.

FIG. 2D shows an example of the reconstructed signal $y_{rec}(n)$ 260. As shown, the first and second half of under-sampled signal $y_{LS}(n)$ are multiplexed (interleaved) to generate the reconstructed signal $y_{rec}(n)$ 260. The reconstructed signal $y_{rec}(n)$ 260 built from sampling (at a rate of $f_S/N$ where N=2 in this example) the output signal $x_{out}(t)$ obtained by applying the synthetic test signal $x_{syn}$ is similar to the signal obtained by sampling (at a rate of $f_S$) the DUT 140's output signal corresponding to the original test signal x(n).

It is noted that the very high degree of similarity between the baseband waveforms of the original test signal x(n) and the synthetic test signal $x_{syn}$ ensures a quasi-identical behavior of the DUT 140 including its static and dynamic distortions. This is expected to lead to quasi-perfect cancellation of the PA distortion when a digital predistortion function will be built using the synthetic test signal rather than the original signal.

A numerical example of a test signal waveform having K=6 samples is provided below to further illustrate the MR-DAD technique. An original waveform is sampled at $f_S$ to generate a test signal x(n) represented as a K×1 vector (in this example K=6) given by $$x=[x(1)x(2)x(3)x(4)x(5)x(6)] \qquad (1).$$

For N=2, the synthetic test signal $x_{syn}$ sampled at $f_S$ is an NK×1 vector, $$x_{syn}=[x(1) \ldots x(6)x(2) \ldots x(6)x(1)] \qquad (2).$$

Accordingly, the under-sampled signal $y_{LS}(n)$ operating at $f_S/N$ at the output of the PA (DUT 140) for N=2, will be a K×1 vector in which the samples appear in the following sequence, $$y_{LS}=[y(1)y(3)y(5)y(2)y(4)y(6)] \qquad (3).$$

Post-processing the under-sampled output signal at the post-processing circuitry/algorithms 160 by multiplexing the first three (K/N=3) samples and the last three samples leads to the reconstructed output signal $y_{rec}(n)$ (K×1 vector) given by $$y_{rec}=[y(1)y(2)y(3)y(4)y(5)y(6)] \qquad (4).$$

The technique described above for the case of N=2 and K=6 can be generalized to any values of N and K provided that K/N is an integer.

Figure 3:
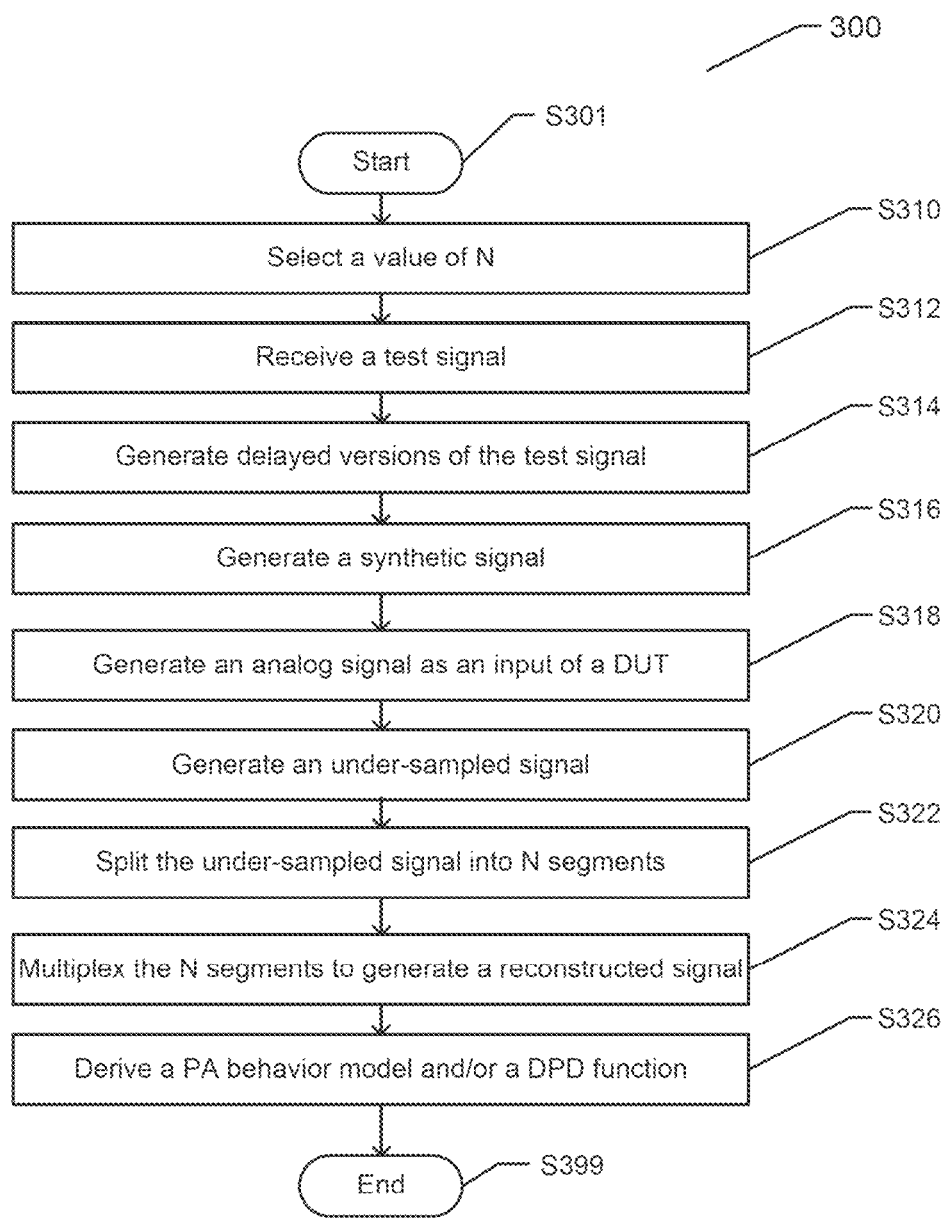
FIG. 3 shows a flow chart of a process for PA characterization and digital predistortion according to one example.

FIG. 3 shows a flow chart of a process 300 for PA characterization and digital predistortion according to one example. In the process 300, a synthetic test signal $x_{syn}$ is built, and a high speed reconstructed signal $y_{rec}(n)$ is constructed from an under-sampled signal $y_{LS}(n)$ measured at a lower speed. The system 100 in FIG. 1 is used as an example to explain the process 300. The process starts at S301 and proceeds to S310.

At S310, an integer value of N is selected. The value of N must be a divisor of K, i.e. K/N is an integer, where K is the number of samples included in a test signal x(n).

At S312, a test signal x(n) is received at the signal pre-processing circuitry/algorithms 120. An example of the test signal x(n) including K samples with a sampling rate $f_S$ can be given by, $$x=[x(1)x(2) \ldots x(l-1)x(l) \ldots x(K)] \qquad (5).$$

In case K is non-divisible by N, in some examples, the signal pre-processing circuitry/algorithms 120 is configured to reduce the number of samples in the test signal to J samples, wherein J is the nearest multiple of N, to generate a reduced signal. Subsequently, the reduced signal is used as the test signal and J is used as K to generate a synthetic test signal.

At S314, a sequence of N−1 delayed versions of the test signal x(n) is generated at the signal pre-processing circuitry/algorithms 120. The first delayed version of the test signal x(n) has one sample delay from the test signal x(n). Each other delayed version of the test signal x(n) in the sequence has one sample delay from a preceding delayed version. The delayed samples of each delayed version are added at the end of the corresponding delayed version. In the example at S312, the j-th copy of the input signal x(n) (for j>1) is $$x_j=[x(j)x(j+1) \ldots x(K)x(l) \ldots x(j-l)] \qquad (6).$$

At S316, a synthetic test signal $x_{syn}$ is generated by appending the sequence of N−1 delayed versions to the test signal x(n) at the signal pre-processing circuitry/algorithms 120. In the above example, the signals $x_2$ through $x_N$ are then concatenated and appended after the signal $x_1$ that corresponds to the original version of the test signal x(n) to build the synthetic signal $x_{syn}$ according to, $$x_{syn}=[x_1 x_2 \ldots x_N] \qquad (7).$$

At S318, an RF analog signal $x_{in}(t)$ is generated based on the synthetic test signal $x_{syn}$ at the signal generator 130, and is applied as an input of the DUT 140. Specifically, the synthetic test signal $x_{syn}$ is converted by the DAC 131 to an analog signal that is subsequently up converted to a high frequency carrier by the up-conversion stage 132.

At S320, a low speed under-sampled signal $y_{LS}(n)$ is generated at the receiver 150. Specifically, an output signal $x_{out}(t)$ of the DUT 140 is down-converted at the down-conversion stage 151 to an intermediate frequency or based band signal which is then sampled at a sampling rate $f_S/N$, which is lower than the sampling rate of the test signal $x(n)$, to generate the under-sampled signal $y_{LS}(n)$. In the above example, the under-sampled signal $y_{LS}(n)$ is represented as, $$y_{LS} = \begin{bmatrix} y_{syn}(1) \\ y_{syn}(N+1) \\ y_{syn}(2N+1) \\ \vdots \\ y_{syn}(N+(K-1)+1) \end{bmatrix}^T, \quad (8)$$

where $y_{syn}(n)$ corresponds to a synthetic output signal that would have been obtained if the sampling rate of $f_S$ was used in the receiver 150 to sample the output signal $x_{out}(t)$ of the DUT 140 driven by the synthetic test signal $x_{syn}$.

At S322, the under-sampled signal $y_{LS}(n)$ is split into N segments each including K/N samples. Accordingly, in the above example, the $j^{th}$ segment can be represented as, $$y_{LS,j} = \begin{bmatrix} y_{LS}\left((j-1)\times\left(\frac{K}{N}\right)+1\right) \\ y_{LS}\left((j-1)\times\left(\frac{K}{N}\right)+2\right) \\ \vdots \\ y_{LS}\left(j\frac{K}{N}\right) \end{bmatrix}^T, \quad (9)$$

where j is an integer varying from 1 to N. It is noted that the waveform length K of the original test signal $x(n)$ is a multiple of N. This condition can be ensured at the beginning of the process 300 through appropriate selection of the length of the original test signal or the value of N.

At S324, the samples in the N segments $y_{LS,j}$ are multiplexed to generate a reconstructed signal $y_{rec}(n)$ including K samples of the under-sampled signal $y_{LS}(n)$. In the above example, the samples in each of the N segments $y_{LS,j}$ are interleaved to generate the reconstructed signal according to, $$y_{rec} = \begin{bmatrix} y_{LS,1}(1) \\ y_{LS,2}(1) \\ \vdots \\ y_{LS,N}(1) \\ y_{LS,1}(2) \\ \vdots \\ y_{LS,N}\left(\frac{K}{N}\right) \end{bmatrix}^T. \quad (10)$$

At S326, a PA behavioral model and/or digital predistortion function are extracted based on the test signal $x(n)$ and the reconstructed signal $y_{rec}(n)$. This process includes time delay estimation and compensation between the signals $x(n)$ and $y_{rec}(n)$, as well as model coefficients and parameters identification. The process proceeds to S399, and terminates at S399.

FIG. 4 shows a table 400 summarizing the characteristics of the different signals in the FIG. 1 example. The different signals are listed in the first column of the table 400 including an output signal of the receiver 150 when conventional approach is used. The characteristics presented include the number of samples (the second column), the sampling rate (the third column), and waveform length (the fourth column) of each of these signals listed in the first column. As shown in the table 400, the value of N has two direct impacts on the measurements. First, it reduces the required sampling rate at the receiver from $f_S$ to $f_S/N$. Second, it increases the length, in terms of number of samples, of the synthetic test signal applied at the input of the DUT 140. Accordingly, if the original test signal $x(n)$, sampled at a rate $f_S$ includes K samples, then the synthetic test signal at the input of the DLT 140 will have N×K samples at a rate of $f_S$. Conversely, the under-sampled signal $y_{LS}(n)$ acquired at the output of the DUT 140 has K samples because it is sampled at $f_S/N$.

The MR-DAD technique utilizes low speed ADCs at the receiver side and extends the distortion characterization and mitigation bandwidths beyond the receiver observation bandwidth, consequently extending the life cycle of current test and measurement equipment, and reducing the cost of experimental setups. In addition, the MR-DAD technique has the advantage of being reconfigurable in terms of required sampling rate for wideband PA characterization while benefiting from the high dynamic range of low speed ADCs.

A theoretical comparison between the acquisition of the DUT output using conventional and the MR-DAD technique is described below. In the conventional approach, the K samples long baseband output waveform y is acquired at a sampling rate of $f_S$. Conversely, in the proposed MR-DAD approach, the K samples baseband output waveform (the reconstructed signal) $y_{rec}$, sampled at $f_S$, is obtained by time multiplexing the N fragments $y_{LS,j}$, of the baseband output waveform $y_{LS}$ measured at a low sampling rate of $f_S/N$.

First, the analysis is performed for N=2, then it is generalized to an arbitrary value of N. In this case, by comparing the data acquired using the high speed and low speed approaches, it appears that the samples of odd indexes in the reconstructed waveform are identical to those acquired at the same instants with the conventional approach. Conversely, the samples of even indexes in the reconstructed and high speed waveforms are acquired at two different time instants. This is further clarified by Eq. (11) below.

Combining Equations (10) and (9), leads to $$\begin{cases} y_{rec}(k) = y_{LS,1}\left(\frac{k+1}{2}\right) = y_{LS}\left(\frac{k+1}{2}\right) & \text{for } k \text{ odd} \\ y_{rec}(k) = y_{LS,2}\left(\frac{k}{2}\right) = y_{LS}\left(\frac{K+k}{2}\right) & \text{for } k \text{ even} \end{cases} \quad (11)$$

where k is an index that varies from 1 to K.

In order to assess the accuracy of the MR-DAD characterization technique, it is useful to examine the difference between acquiring the DUT output signal using the conventional approach and acquiring it using the MR-DAD approach. In the conventional approach, the output signal is sampled at $f_S$ to obtain the baseband waveform y. Conversely, in the MR-DAD approach, the output is sampled at $f_S/2$ to obtain the baseband waveform (the under-sampled signal) $y_{LS}$. This latter waveform is then digitally processed to build the reconstructed signal $y_{rec}$. Based on (8) and (11), it appears that odd order samples of both output waveforms (y and $y_{rec}$) are the same, while even order samples are acquired at two different instants. Thus, it is expected that even order samples of the output signals y and $y_{rec}$ will not be perfectly identical. Accordingly, $$\begin{cases} y_{rec}(k) = y_{syn}(k) = y(k) & \text{for } k \text{ odd} \\ y_{rec}(k) = y_{syn}(K+k-1) = y(k) + \varepsilon(k) & \text{for } k \text{ even} \end{cases} \quad (12)$$

where k is an index that varies from 1 to K, and ε (k) represents the measurement error for the kth sample of the reconstructed output signal.

The Discrete Fourier Transform (DFT) of the output waveforms y(k) and $y_{rec}$(k) are, by definition, given by, $$Y(f) = \sum_{k=1}^{K} y(k) e^{-j\frac{2\pi f}{K}k} \text{ and} \quad (13)$$

$$Y_{rec}(f) = \sum_{k=1}^{K} y_{rec}(k) e^{-j\frac{2\pi f}{K}k}. \quad (14)$$

Transforming (12) in frequency domain using (14) gives, $$Y_{rec}(f) = \left[\sum_{\substack{k=1 \\ k \text{ odd}}}^{K-1} y(k) e^{-j\frac{2\pi f}{K}k}\right] + \left[\sum_{\substack{k=2 \\ k \text{ even}}}^{K} [y(k) + \varepsilon(k)] e^{-j\frac{2\pi f}{K}k}\right]. \quad (15)$$

Rearranging Eq. (15) as follows, $$Y_{rec}(f) = \left[\sum_{\substack{k=1 \\ k \text{ odd}}}^{K-1} y(k) e^{-j\frac{2\pi f}{K}k}\right] + \quad (16)$$

$$\left[\sum_{\substack{k=2 \\ k \text{ even}}}^{K} y(k) e^{-j\frac{2\pi f}{K}k}\right] + \left[\sum_{\substack{k=2 \\ k \text{ even}}}^{K} \varepsilon(k) e^{-j\frac{2\pi f}{K}k}\right].$$

The relationship between the DFT of the original and the reconstructed output signals can then be written as, $$Y_{rec}(f) = Y(f) + \left[\sum_{k=1}^{\frac{K}{2}} \varepsilon(2k) e^{-j\frac{2\pi f}{K}(2k)}\right]. \quad (17)$$

Equation (17) describes the DFT of the reconstructed output baseband waveform with the MR-DAD technique for N=2. For any value of N, the generalized form of (17) can be written as:

$$Y_{rec}(f) = Y(f) + \sum_{n=2}^{N} \left[\sum_{m=1}^{\frac{K-N+n}{2}} \varepsilon_n(N \cdot m) e^{-j\frac{2\pi f}{K}(N \cdot m)}\right] \quad (18)$$

where $\varepsilon_n$ is the measurement error vector corresponding to the n-th segment of the baseband output waveform ($y_{LS,n}$).

By evaluating then the last term of Eq. (18), it is possible to predict the effect that the MR-DAD technique will have on the spectrum of the reconstructed signal. This can be done easily due to the fact that the error between the original signal and the reconstructed one is demonstrated to be a simple additive term given by, $$\Delta Y_N(f) = \sum_{n=2}^{N} \left[\sum_{m=1}^{\frac{K-N+n}{2}} \varepsilon_n(N \cdot m) e^{-j\frac{2\pi f}{K}(N \cdot m)}\right]. \quad (19)$$

Figure 5:
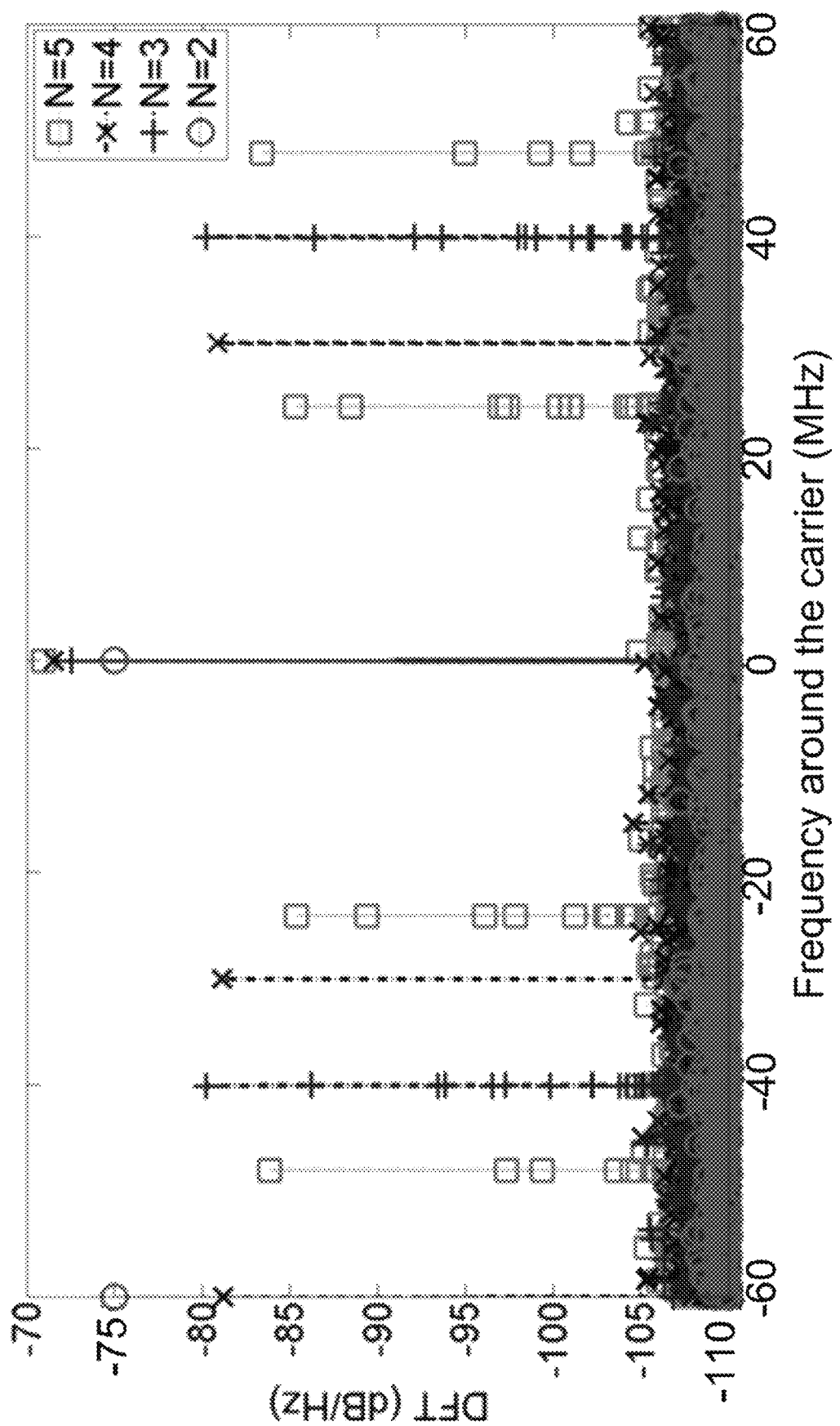
FIG. 5 shows a discrete Fourier transform (DFT) of error $\Delta Y_N$ for several values of N.
Figure 6:
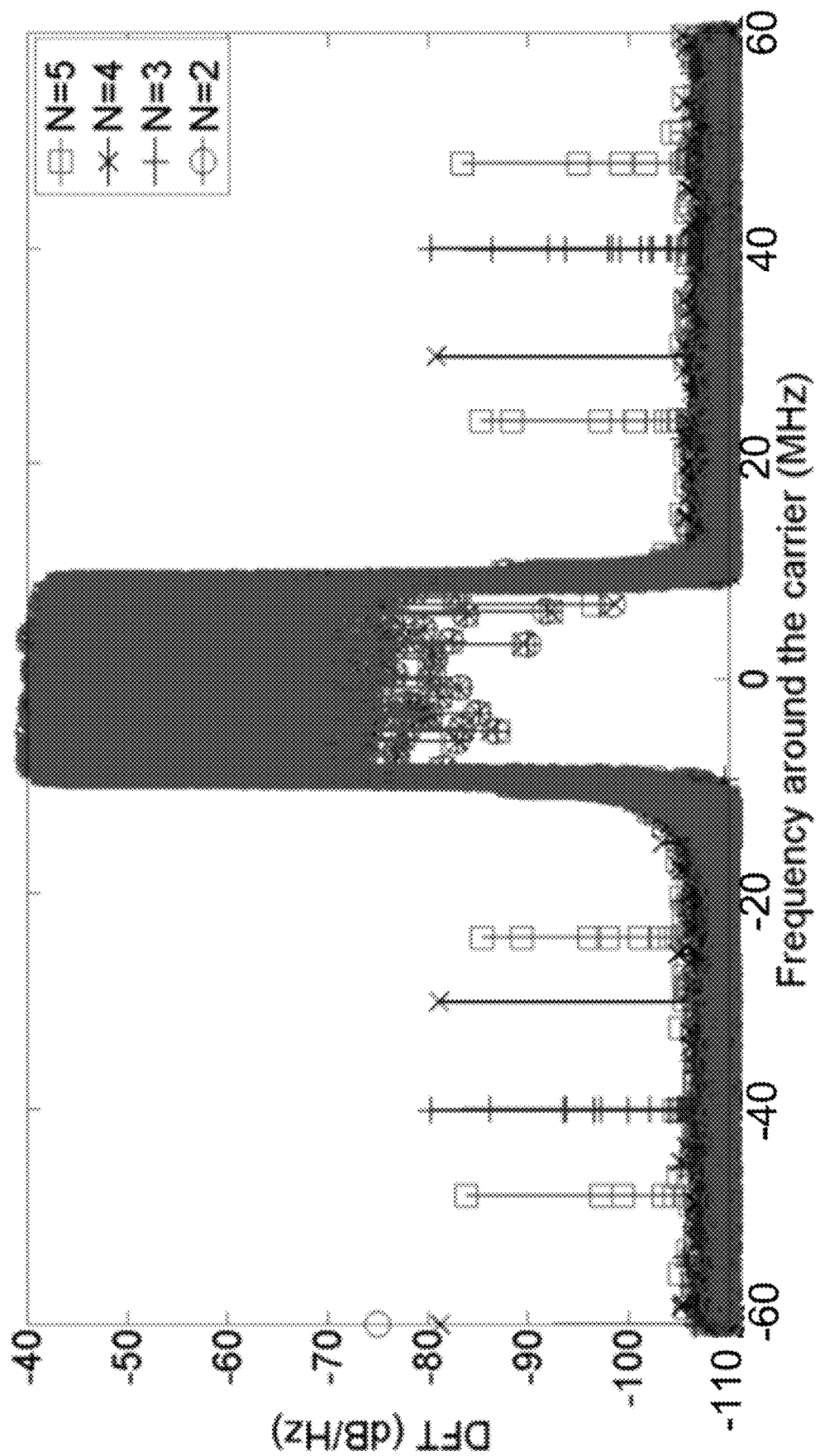
FIG. 6 shows ta DFT of a simulated reconstructed signal for several values of N.

FIG. 5 shows a DFT of the error $\Delta Y_N$ for several values of N. In this figure, $\varepsilon_n$ had a normal distribution scaled to represent measurement errors. The impact of the MR-DAD technique can be seen in specific frequency components that depend on the value of N. The reconstructed signal is likely to have, in addition to the original signal frequency components, the same predicted frequency components present in FIG. 5 which are due to the wrapping technique only. To confirm this, the wrapping is implemented with a MATLAB™ simulation for several values of N, and the DFT of the reconstructed signal is calculated. An LTE signal with a bandwidth of 20 MHz is used with the same error distribution $\varepsilon_n$. FIG. 6 shows the DFT of the simulated reconstructed signal for several values of N. The reconstructed signal exhibits identical frequency components to the ones predicted by Eq. (19) in FIG. 5. It is clear then that the effect of the MR-DAD technique described herein on the reconstructed signal characteristics can be predicted and precisely calculated and is therefore easy to compensate for, if needed.

Figure 7:
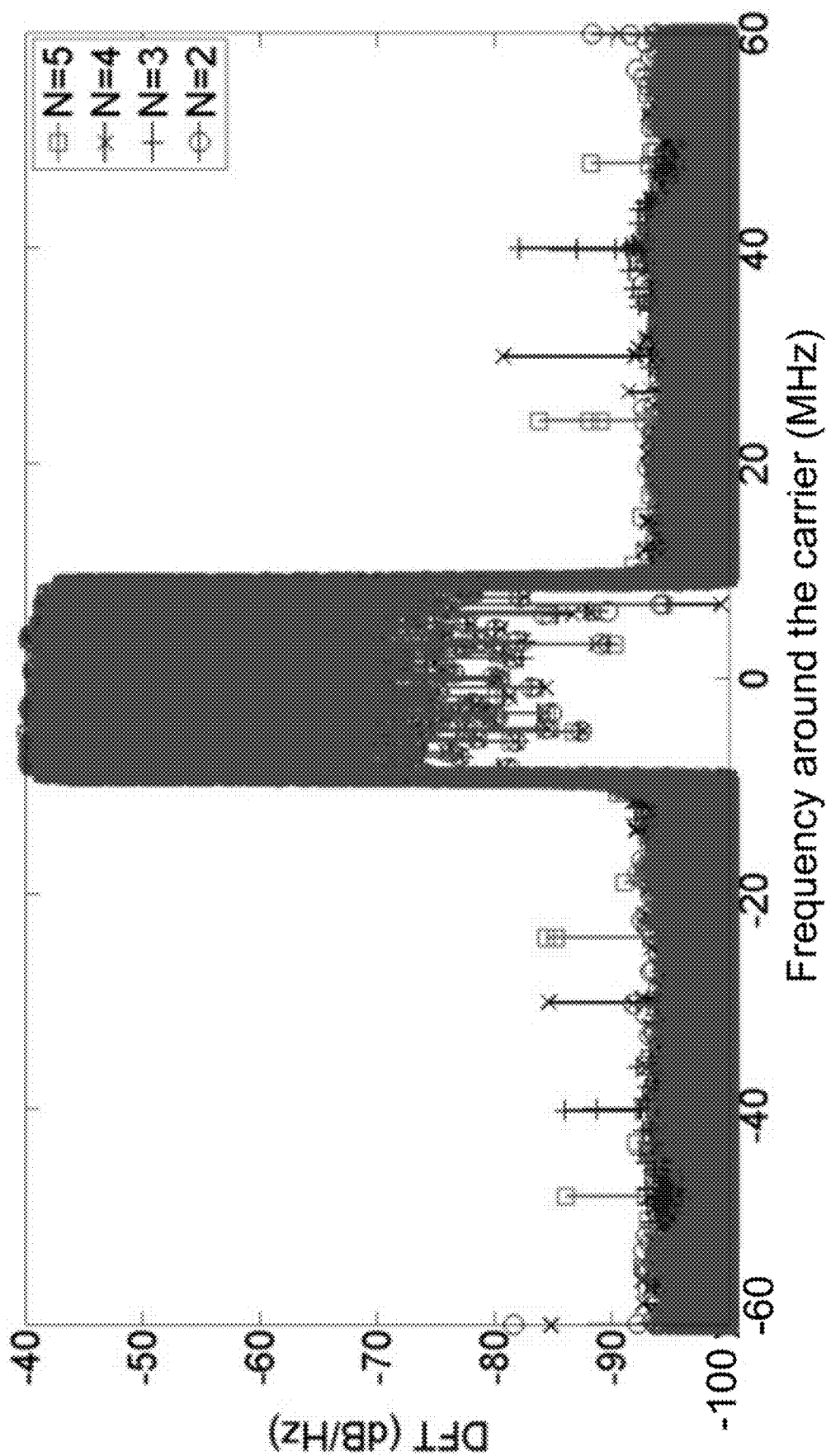
FIG. 7 shows a DFT of a measured reconstructed signal for several values of N.
Figure 8:
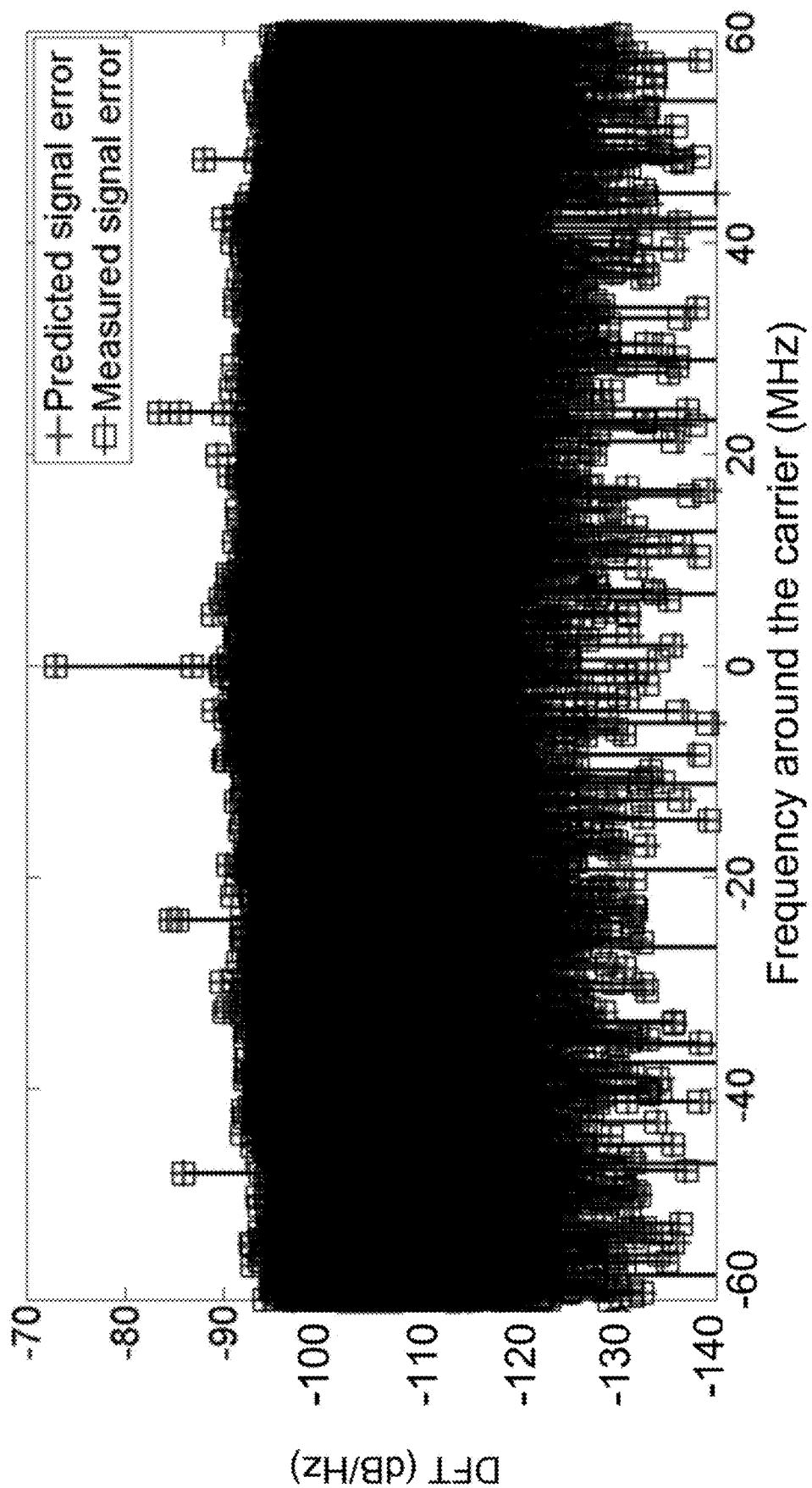
FIG. 8 shows a DFT of a measured and predicted error signals for N=5.

In addition to the simulations, the MR-DAD technique was implemented with a vector signal generator connected directly to a vector signal analyzer in order to investigate and confirm whether or not the predicted frequency components are present. In this implementation, the vector signal generator performs functions of the signal generator 130 in FIG. 1 example, and the vector signal analyzer performs functions of the receiver 150 in FIG. 1 example. The functions of the signal pre-processing circuitry/algorithms 120 and the signal post-processing circuitry/algorithms 160 are implemented with MATLAB™. FIG. 7 shows the DFT of the measured reconstructed signal for several values of N and confirms what Eq. (19) predicts in terms of errors between the original signal and the reconstructed one. This is further demonstrated in FIG. 8. FIG. 8 shows the DFT of the measured and predicted error signals for N=5. In FIG. 8, the signal error due to the MR-DAD technique is calculated, for N=5, with (19) and as follows, $$\Delta Y_N(f) = Y_{rec}(f) - Y(f) \quad (20).$$

It is clearly shown in FIG. 8 that the prediction of the effect of the MR-DAD technique is accurately achieved with (19).

Consequently, the effect of the wrapping technique has been assessed, formulated by (19), and calculated in the form of a signal error in the frequency domain. The reconstructed signal resemblance to the original signal is also assessed in the time domain using the normalized root-mean-square error (NMSE) figure of merit. The calculated NMSE values that correspond to the cases where N=2, 3, 4 and 5 are −57 dB, −60 dB, −61 dB, and −61 dB, respectively. This level of NMSE shows that the effect of the MR-DAD technique can be neglected and not compensated for without any significant impact on the characterization accuracy for both behavioral modeling and digital predistortion applications.

Two examples of PA linearization using the MR-DAD technique described herein are described below. Specifically, the two examples are two experimental setups for validating the MR-DAD technique described herein. Both setups are conceptually similar to the system 100 of FIG. 1. For both cases, the signal source, signal pre- and post-processing as well as the PA characterization and DPD synthesis algorithms are implemented in software such as MATLAB™ for example. A vector signal generator and a vector signal analyzer are used in place of the signal generator 130 and the receiver 150, respectively.

In one example, an anti-aliasing filter with a bandwidth wide enough in order not to filter any frequency component of the signal that will be under-sampled is used when implementing the techniques described herein. This can provide enhanced reconstruction of the signal in the post-processing step. However, most of the commercial instruments include band limited intermediate frequency (IF) filters with bandwidths that are commensurate to the sampling rate of the ADC in order to avoid aliasing. In most of the cases, setting the sampling rate of the vector signal analyzer (VSA) will automatically select an IF filter that has narrower bandwidth than the sampling frequency entered in order to avoid aliasing. In these instruments, depending on the manufacturer, the ratio between the ADC sampling rate and the anti-aliasing filter bandwidth is equal to a predefined constant.

In the first experimental setup used in this work, the sampling rate of the VSA and the bandwidth of its anti-aliasing filter were "locked", in the sense that they could not be independently controlled. Thus, the first test was performed to evaluate the potential of the concept while performing the under-sampling in an artificial way by sampling the VSA input signal at a high speed and then deliberately sub-sampling the digital signal within the signal processing software. On the other hand, the VSA used in the second set of experiments allows for the independent control of the sampling rate and the anti-aliasing filter bandwidth. In this case, it was possible to assess the performance of the MR-DAD technique in a fully realistic context by setting the bandwidth of the anti-aliasing filter to its widest value while successively reducing the sampling rate to under-sample the test signal in the hardware.

The first test focused on validating the signal decomposition and reconstruction. This setup includes a vector signal generator (VSG), followed by a high output power linear driver, the DUT and an output attenuator (10 dB) to accommodate the maximum power handling capabilities of the following VSA.

The PA architecture used in this first test is an inverse class-F PA operating at 900 MHz. A 20 MHz LTE signal was used to characterize this PA using a VSA sampling speed of 120 Msps. This is where a high enough sampling rate is adopted at the receiver to ensure the inclusion of all significant adjacent channels and thus optimal DPD performance. This approach is used as a benchmark to evaluate the performances of the MR-DAD technique. For this purpose, several tests were performed using the MR-DAD technique in which N was successively increased from 2 up to 5. Accordingly, in these tests, the sampling frequency of the VSA was reduced from 60 Msps for N=2 to 24 Msps for N=5. As mentioned above, the VSA used in this first test automatically adjusted the anti-aliasing IF filters bandwidths depending on the sampling rate which compromises the MR-DAD approach. Therefore, to avoid this hardware limitation, the low sampling speeds quoted above were emulated by simply decimating the measurements sampled at 120 Msps.

Figure 9:
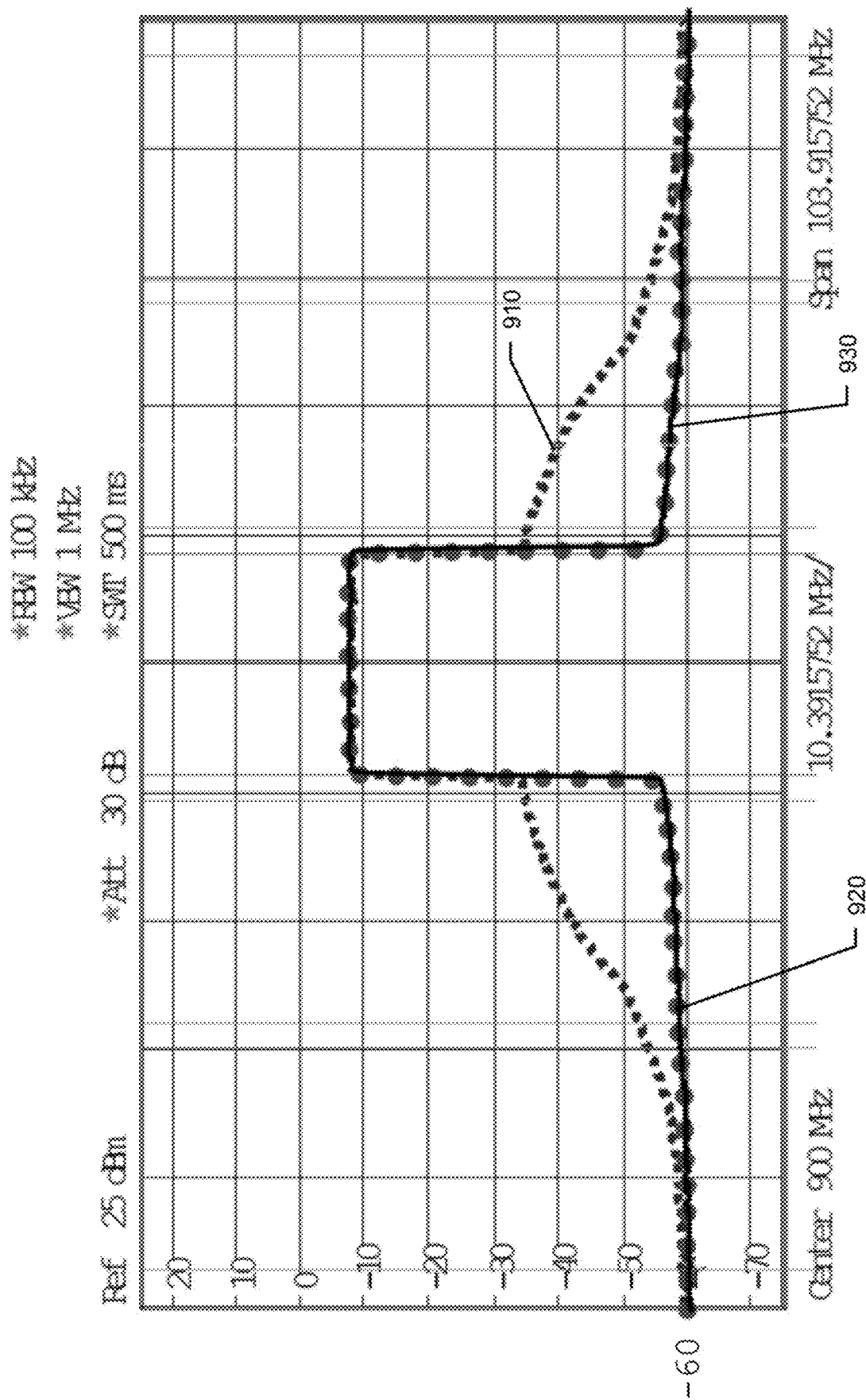
FIG. 9 shows a measured spectrum at output of a linearized device-under-test (DUT) using benchmark technique and MR-DAD technique with N=5.

The DPD can be implemented using a memory polynomial structure having a memory depth of 3 and a nonlinearity order of 9 for example. FIG. 9 shows the measured spectrum at the output of the linearized DUT using the benchmark technique and the MR-DAD technique with N=5. As shown, the curve 910, the curve 920 (dots), and the curve 930 (solid line) represent the measured spectrum without DPD, with DPD based on classic measurement method, and with DPD based on the MR-DAD technique with N=5, respectively. This figure demonstrates the effectiveness of the MR-DAD approach in perfectly linearizing the DUT even with an observation bandwidth that is as low as 1.2 times the bandwidth of the input signal. This evidently contrasts with common practice where the observation bandwidth is up to 5 times wider than the input signal bandwidth.

Detailed results of exemplary DPD performance as a function of the value of N are presented in FIG. 10. This table shows that the linearization performance is independent of N, and that despite a significant decrease in the VSA sampling rate, the performance of the DPD remains similar to that obtained with a high speed sampling rate. Indeed, the MR-DAD DPD approach maintains almost quasi-unchanged adjacent channel leakage ratios of −50.6 dB and −52.3 dB in the adjacent and the alternate adjacent channels, respectively.

Moreover, an EVM of less than 1% is maintained. Assessing the success of the DPD synthesized with the MR-DAD technique is a good way to prove that the nonlinearities extraction, including memory effects, is accurate. Furthermore, the successful PA linearization obtained with the MR-DAD technique here is achieved without any compensation of the signal error that can be predicted by Eq. (19). Thus, the used measurement setup (VSG and VSA) is capable of performing vector signal acquisition with a reliable level of repeatability which corroborates that the signal error associated with the MR-DAD acquisition technique can be neglected. Moreover, the successful implementation of the DPD using the MR-DAD approach clearly demonstrates the ability of the signal pre- and post-processing algorithms in compensating for the aliasing due to the under-sampling process, and reveals its effectiveness when signals having contiguous spectrum are handled.

The second experimental set of measurements was performed using a different hardware set-up which provides more flexibility in the control of the anti-aliasing filter bandwidth. A VSG used is an arbitrary waveform generator connected to equipment for frequency up-conversion, and a VSA was used. The VSA option used provides up to 320 MHz analysis bandwidth. In this VSA, it is possible to maintain the bandwidth of the anti-aliasing filter to its widest value while decreasing the sampling rate at which the ADCs will operate. This allows for the implementation of the under-sampling process within the hardware in contrast with the previous set of tests where the under-sampling was emulated in the signal processing software.

The DUT used in this second test is a Doherty architecture based on LDMOS devices. The test signal is an LTE-Advanced signal composed of two contiguous 20 MHz LTE signals centered at 2.14 GHz. To allow for a fine tuning of the sampling frequency during the test, the sampling frequency of the original signal was intentionally set to 368.64 Msps. In these experiments, the sampling frequency at the VSA was set to 368.64/N Msps, and N varied from 2 up to 9.

Figure 11A:
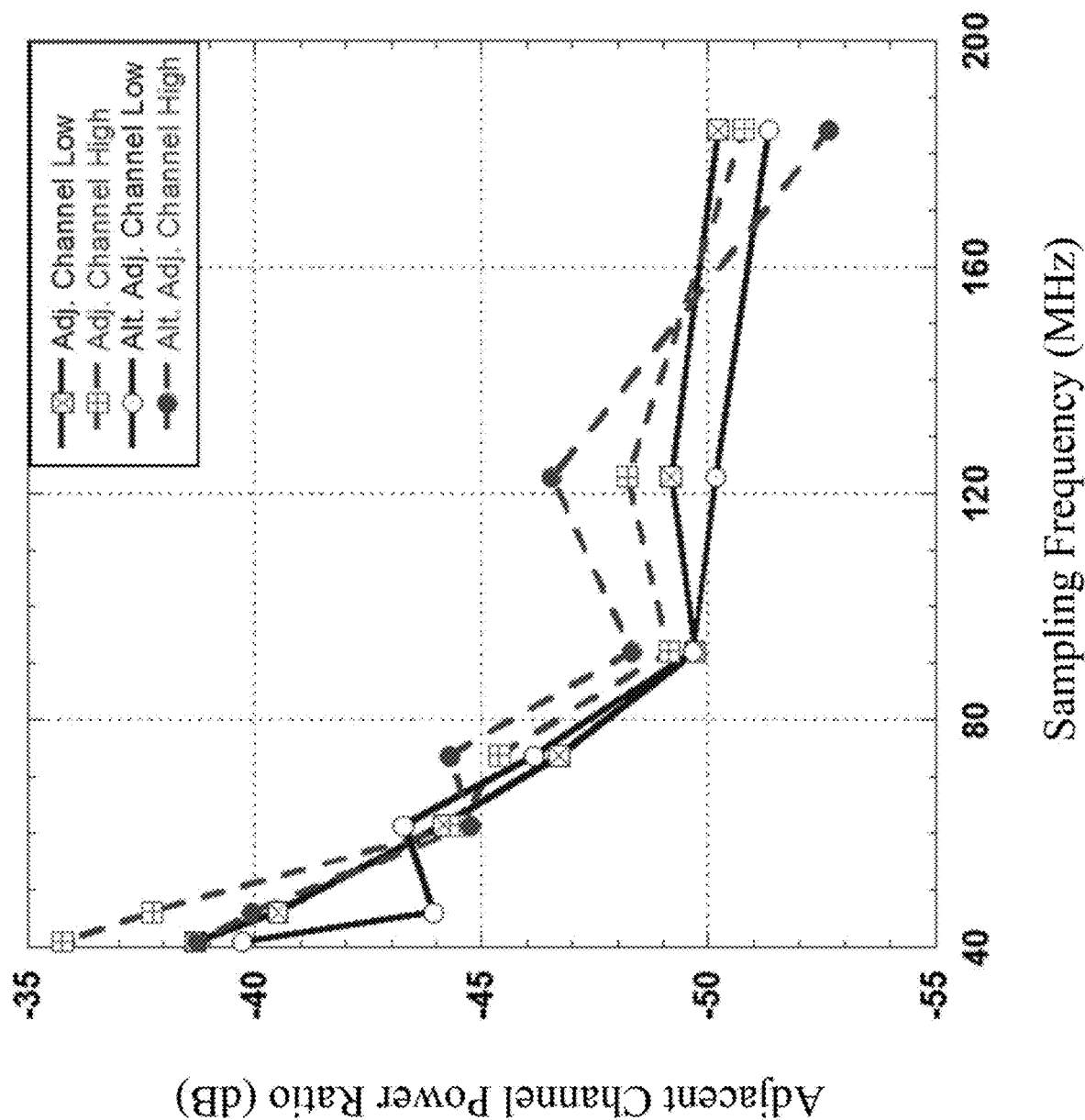
FIG. 11A shows measured adjacent channel leakage ratios (ACLR) at an output of the PA with conventional DPD as a function of vector signal analyzer (VSA) sampling rate.
Figure 11B:
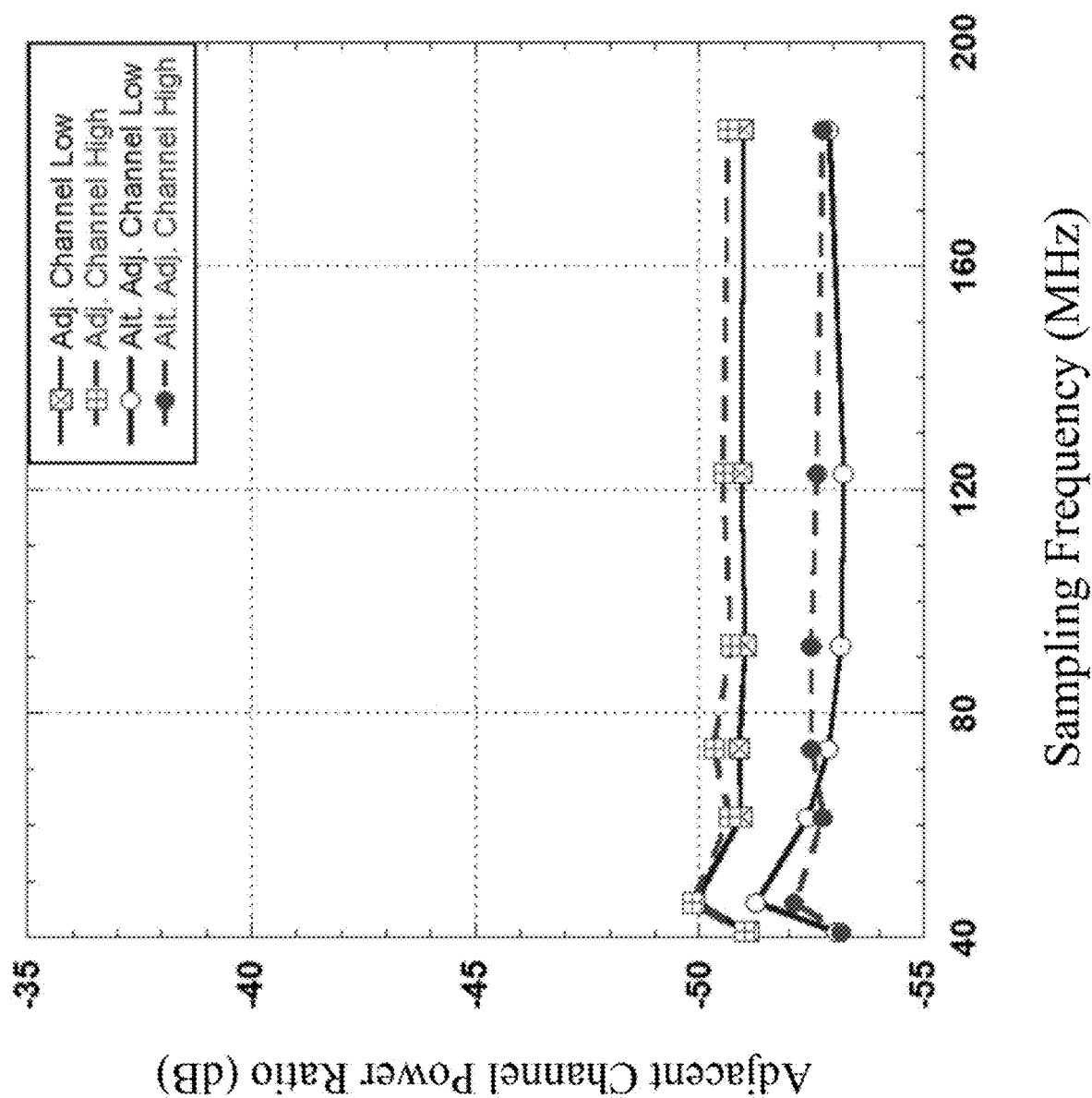
FIG. 11B shows measured adjacent channel leakage ratios (ACLR) at an output of the PA with MR-DAD DPD as a function of vector signal analyzer (VSA) sampling rate.

For each value of the VSA sampling rate, two DPDs were derived. The first was synthesized using a conventional approach where the input signal is the original one which does not include any appended delayed replicas. The second DPD was constructed using the MR-DAD technique in which the under-sampling was implemented within the VSA hardware. In both approaches the DPD function was a memory polynomial having a nonlinearity order of 10 and a memory depth of 6. The measurement results are summarized in FIGS. 11A and 11B which show the measured ACLR in the lower and upper adjacent and alternate adjacent channels at the output of the PA with conventional DPD and with MR-DAD DPD, respectively, as a function of vector signal analyzer (VSA) sampling rate. The measured ACLR is shown as a function of the feedback ADC sampling rate measured with 40 MHz LTE-A input signal.

As shown, it appears that the conventional approach requires a minimum sampling rate of 92.16 Msps to meet the ACLR threshold of the LTE standard. However, as expected from the previous results, the MR-DAD based DPD technique maintains the distortion compensation even when a rate of 40.96 Msps is used to characterize the DUT driven by the 40 MHz LTE-A signal and synthesize its predistorter.

Figure 12B:
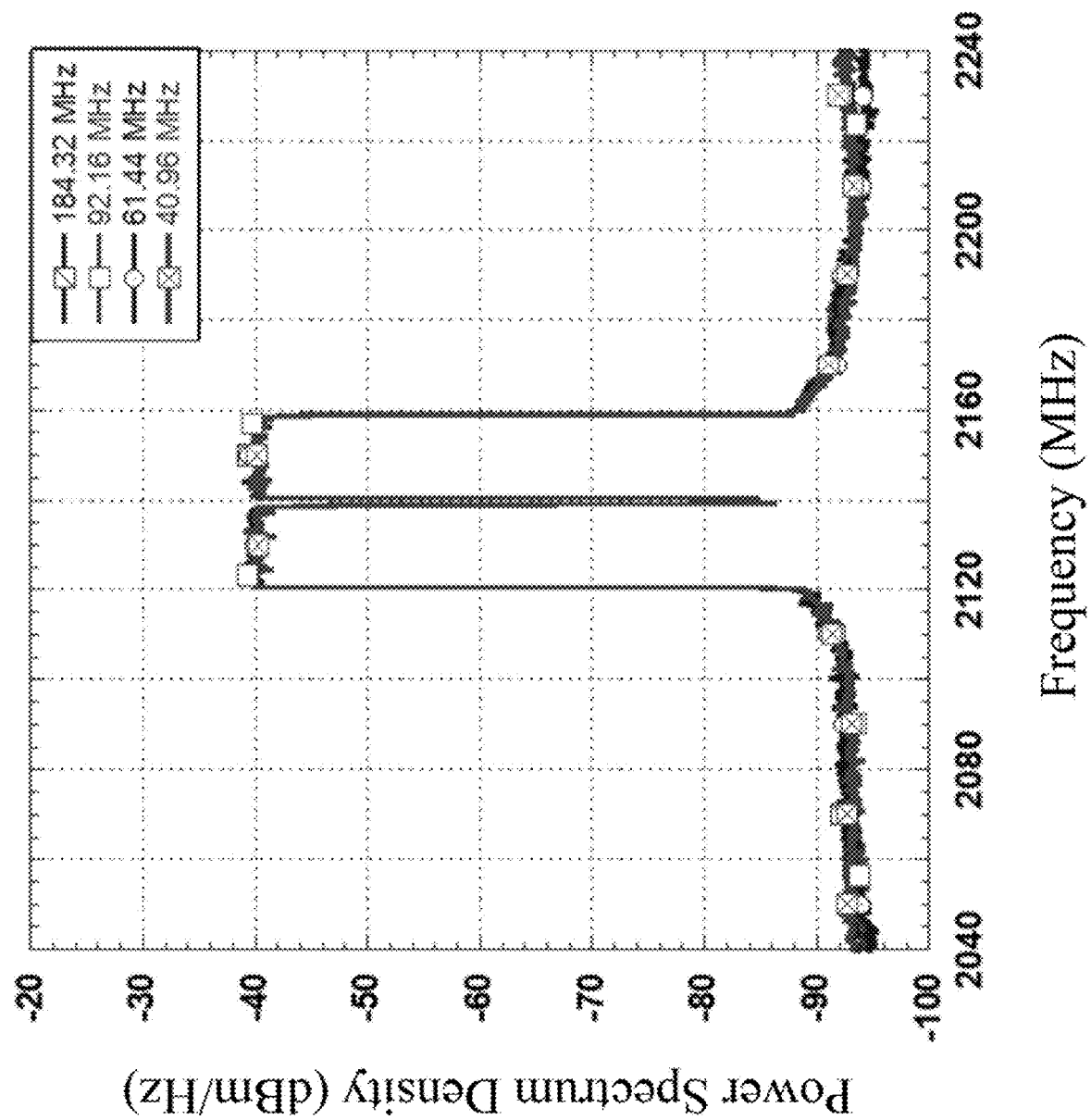
FIG. 12B shows measured spectra at an output of a DUT as a function of vector signal analyzer (VSA) sampling rate with MR-DAD DPD.

FIGS. 12A and 12B show the measured spectra at the output of the DUT as a function of the VSA sampling rate when the predistorter is built using each of the two approaches described above (with conventional DPD or with MR-DAD DPD). FIG. 12A illustrates the performance degradation as a function of the sampling rate in the case of the conventional approach. Conversely, FIG. 12B demonstrates the robustness of the proposed MR-DAD approach when the sampling rate is decreased.

Figure 13:
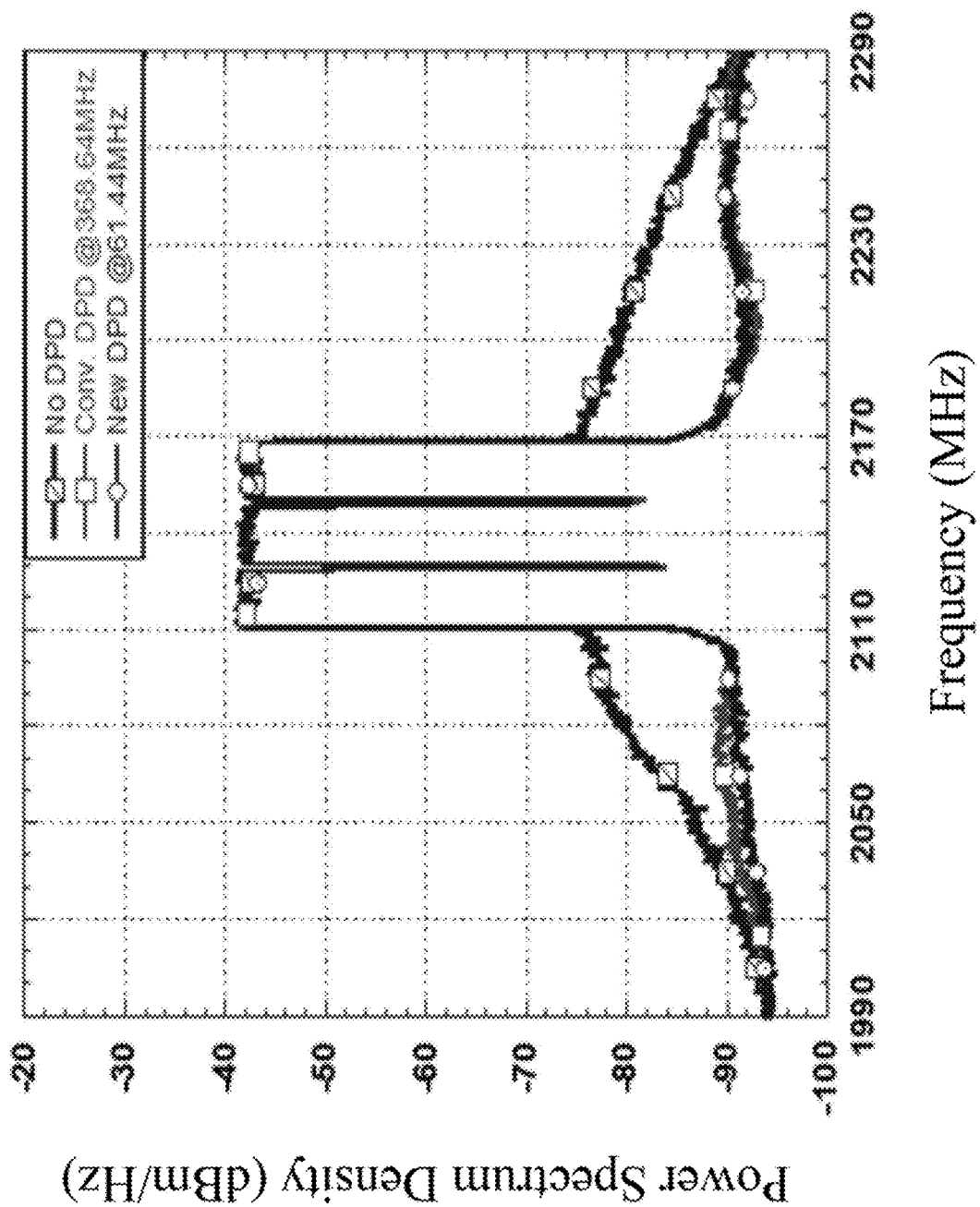
FIG. 13 shows measured spectra at an output of a linearized PA without DPD, with conventional DPD, and with MR-DAD DPD.

The second setup was also used to linearize the DUT when drive by a 3-carrier LTE-A signal having a total bandwidth of 60 MHz. A first DPD was built using the conventional approach in which the output signal was sampled at 368.64 Msps. A second DPD was constructed with the MR-DAD method while sampling the output signal at only 61.44 Msps which corresponds to N=6. The spectra measured at the output of the linearized amplifier are shown in FIG. 13. Specifically, FIG. 13 shows the measured spectra at the output of the linearized PA without DPD, with conventional DPD, and with MR-DAD DPD. This further confirms the performance of the MR-DAD DPD and its ability to lead to same linearity as the conventional one while requiring significantly less sampling speed in the feedback path.

While aspects of the present disclosure have been described in conjunction with the specific embodiments thereof that are presented as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A system comprising:
processing circuitry configured to,
receive a test signal including K samples with a sampling rate $f_S$, and
generate a synthetic test signal including the test signal and a sequence of (N−1) delayed versions of the test signal, the first delayed version of the test signal having one sample delay from the test signal, each other delayed version of the test signal in the sequence having one sample delay from a preceding delayed version, delayed samples of each delayed version being added at the end of the respective delayed version,
generate an under-sampled signal including M samples by sampling, with one analog to digital converter (ADC) at a sampling, rate $f_S/N$, an output signal of a device-under-test (DUT) with the synthetic test signal modulated by one carrier frequency as an input of the DUT the M samples of the under-sampled signal including N segments each including K/N samples, and
generate a reconstructed signal including the M samples of the under-sampled signal,
generate an analog signal based on the synthetic test signal, the analog signal being input to the DUT, and
synthesize a digital predistortion function to compensate the non-linearity of the DUT.

2. The system of claim 1, wherein the processing circuitry is further configured to,
append the sequence of (N−1) delayed versions to the test signal to generate the synthetic test signal.

3. The system of claim 1, wherein the processing circuitry is further configured to,
split the under-sampled signal into the N segments each including the K/N samples, and
multiplex the KIN samples in the N segments to generate the reconstructed signal.

4. The system of claim 1, wherein K is an integer divisible by N that is an integer greater than 1, and the sampling rate $f_S$ is divisible by N.

5. The system of claim 1, wherein the processing circuitry is further configured to reduce, when K is an integer non-divisible by N which is an integer greater than 1, the number of samples in the test signal to a number J, which is the nearest multiple of N, to obtain a reduced signal used as the test signal, with J being substituted for K, to generate the synthetic test signal.

6. The system of claim 1, wherein the processing circuitry is further configured to,
derive a DUT behavioral model and/or digital predistortion (DPD) function based on the test signal and the reconstructed signal.

7. The system of claim 6, further comprising circuitry configured to perform a predistortion to an input signal to the DUT to cancel out a nonlinear behavior of the DUT according to the DPD function.

* * * * *